United States Patent [19]

Hosoki et al.

[11] Patent Number: 4,772,821
[45] Date of Patent: Sep. 20, 1988

[54] APPARATUS FOR INTRODUCING OXYGEN GAS

[75] Inventors: Shigeyuki Hosoki, Hachioji; Mikio Ichihashi, Kodaira; Keiji Takata, Koganei; Hiroyasu Kaga, Katsuta, all of Japan

[73] Assignee: Hitachi, Ltd., Tokyo, Japan

[21] Appl. No.: 911,786

[22] Filed: Sep. 26, 1986

[30] Foreign Application Priority Data

Sep. 30, 1985 [JP] Japan ................................. 60-214716

[51] Int. Cl.⁴ ......................... H01J 17/26; A61L 9/00
[52] U.S. Cl. .................................... 313/551; 313/563; 222/4; 222/146.5
[58] Field of Search ..................... 313/551, 563; 222/4, 222/146.5

[56] References Cited

U.S. PATENT DOCUMENTS 2,804,563  8/1957  Palmer ................................. 313/551

FOREIGN PATENT DOCUMENTS 103968  3/1975  Japan .

Primary Examiner—David K. Moore
Assistant Examiner—Sandra L. O'Shea
Attorney, Agent, or Firm—Antonelli, Terry & Wands

[57] ABSTRACT

An oxygen gas introducing apparatus for introducing oxygen gas into a vacuum electron optical column of an electron beam apparatus having an electron beam source as a cathode that needs the oxygen gas is disclosed which comprises a silver cylinder having a closed end and provided on a side wall of the vacuum electron optical column so as to project from an outside atmospheric side to an interior of the vacuum electron optical column, and a heating member electrically insulated and disposed within an interior of the silver cylinder which interior is in communication with the atmosphere.

4 Claims, 2 Drawing Sheets

1

APPARATUS FOR INTRODUCING OXYGEN GAS

BACKGROUND OF THE INVENTION

The present invention relates to an apparatus for introducing oxygen gas into a vacuum chamber, and more particularly to an apparatus for introducing oxygen gas into a vacuum electron optical column of an electron beam instrument such as an electron microscope, an electron beam lithography system, or the like in which an electron gun having a thermal field emission cathode that needs a minute partial pressure of oxygen gas is used as an electron source.

A method for introducing oxygen gas into a vacuum chamber without an oxygen gas cylinder is known in which the oxygen gas may be introduced into the vacuum chamber by heating a thin silver plate or cylinder located for partitioning the atmosphere or oxygen atmosphere and the vacuum chamber from each other.

On the other hand, in electron beam applied systems such as a scanning type electron microscope and an electron beam lithography system, a thermal field emission cathode must be used in order to cause an electron beam source to have a higher brightness to make a converged beam fine and to increase the beam current. In particular, a minute oxygen gas partial pressure is often needed when an electron gun is used. That electron gun is constructed so that at least one of metals of titanium (Ti), zirconium (Zr) and hafnium (Hf) that are capable of inducing a large current and are superior in current stability is absorbed through the oxygen and adhered to a monocrystalline tip surface of tungsten or molybdenum having a directional property of [100] to form a substantially mono-atom layer (see Japanese patent unexamined publication No. 61,733/81). In this case, if the oxygen gas introducing system using the above-described thin silver plate or cylinder is used, it is unnecessary to use an oxygen gas cylinder that is large in physical dimension and that needs an adjusting valve for introducing a minute amount of the oxygen gas, and hence, it is easy to introduce the oxygen gas into a desired section.

The oxygen gas introducing apparatus using the silver cylinder has heretofore been applied as disclosed in Japanese patent unexamined publication No. 103,968/75. Namely, as shown in cross-section in FIG. 1 a current is supplied to a heating wire 2 arranged around an outer periphery of a silver cylinder 1 which extends from a vacuum mirror wall 5 to the atmosphere, so that the wire 2 is heated. As a result, the atmosphere 3 existing between the silver cylinder 1 and a cover 4 or the oxygen gas of the oxygen gas atmosphere having a pressure that is substantially equal to the atmospheric pressure is introduced into the vacuum chamber.

However, such a structure suffers from problems such that (1) a heating electric power required for heating the wire is large and (2) an oxygen introduction efficiency is decreased. If the amount of the introduced oxygen is increased in order to solve the latter problem (2), the heating power for heating the wire will be further increased. This causes another problem that (3) the silver cylinder 1 would be locally molten to induce a serious accident.

Thus, the conventional oxygen gas introducing apparatus disposed in the vicinity of the thermal field emission type electron gun chamber involves various practical problems; that is, the problem (1) causes a obstacle of electromagnetic induction in the electron gun, the problem (2) makes it difficult to control the necessary oxygen gas partial pressure, and the problem (3) leads to the break-down of the cathode with the electric discharge. Effforts made to cope with these problems in the conventional apparatus are insufficient.

SUMMARY OF THE INVENTION

An object of the present invention is to provide an oxygen gas introducing apparatus which can overcome the above-noted problems, and needs a decreased amount of electric power for heating a heating wire with a high oxygen introduction efficiency.

According to the present invention, in order to attain this and other objects, in an apparatus for introducing the oxygen gas into the vacuum chamber that needs the oxygen gas, a silver cylinder having a closed distal end extends on a side wall of the vacuum chamber from the external atmospheric side to the vacuum chamber, and a heating element is disposed in an interior, of the cylinder, communicating with the atmosphere.

DETAILED DESCRIPTION OF THE PREFERRED EMBODIMENTS

Figure 1:
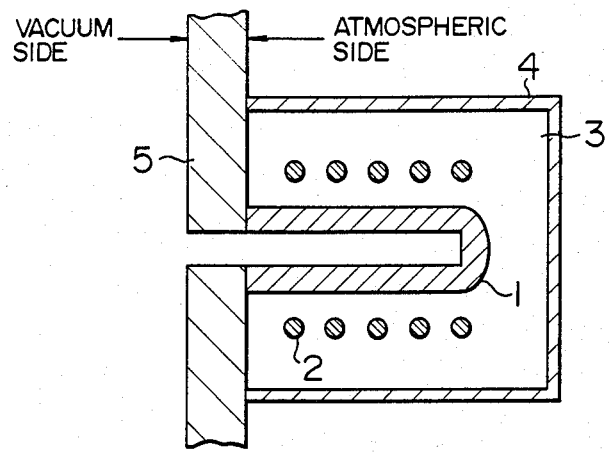
FIG. 1 is a cross-sectional view of a prior art oxygen gas introducing apparatus.
Figure 2:
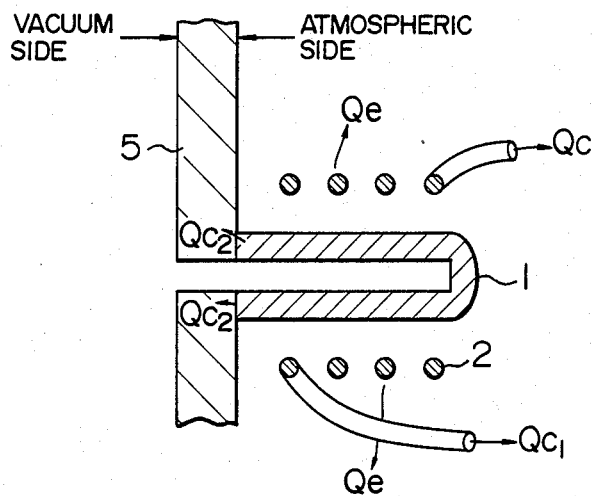
FIG. 2 is a view for illustrating a heat loss upon heating in the prior art apparatus.
Figure 3:
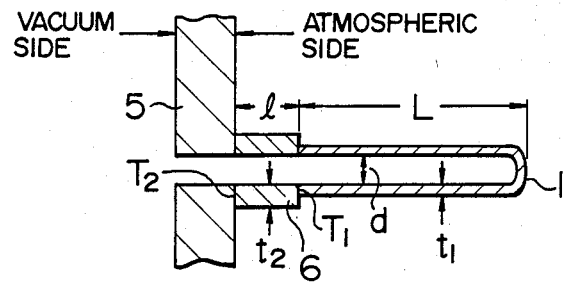
FIG. 3 is a cross-sectional view of another prior art oxygen gas introducing apparatus.

Before explaining an embodiment of the invention, a technical concept of the present invention will now be described with reference to FIGS. 2 and 3. Reduction of a heating electric power to be supplied to a heating wire 2 depends on how effectively a silver cylinder 1 is heated; that is, as an essential problem, how a heating loss upon the heating may be reduced. In the structure, as shown in FIG. 1, in which the heating wire 2 is not brought into contact with the silver cylinder 1 but arranged around the cylinder 1, the heating of the silver cylinder 1 is attained only by radiating heat from the heating wire 2. Therefore, in this case, it is necessary to increase a temperature of the heating wire 2, which is very ineffective. The heat loss involves a conductive heat loss $Q_{c2}$ of the heating wire per se, radiative heat loss $Q_e$ from the heating wire 2 to the parts other than the silver cylinder 1 and a conductive heat loss $Q_{c2}$ leaking from the silver cylinder 1 through a connection between the silver cylinder 1 and a vacuum electron optical column surface. In order to reduce the electric power, it is necessary to reduce these heat losses.

If the heat losses ($Q_{c1}$ and $Q_e$) of the heating wire 2 would be kept at zero and the heating efficiency could be 100%, an ideal necessary heating power could be determined by the heat loss $Q_{c2}$. FIG. 3 illustrates the conductive heat loss which will be generated in the case where a connecting cylinder 6 is interposed between the silver cylinder 1 and the vacuum electron optical column wall 5 in order to decrease the heat conduction. In FIG. 3, character d is the inner diameter of the silver cylinder 1 and the connecting cylinder 6, $t_1$ is a thickness of the silver cylinder 1, L is the length of the silver cylinder 1, $t_2$ is the thickness of the connecting cylinder 6, and l is the length of the connecting cylinder 6. Since the heat conductivity of silver is very high as 0.998 cal·cm$^{-1}$·s$^{-1}$·deg$^{-1}$ (20° C.), it is possible to assume that the temperature of the silver cylinder 6 may be kept uniform thereover. Assuming that $T_1$ is the temperature at the connection between the silver cylinder 1 and the connecting cylinder 6 and $T_2$ is the temperature of the connection between the connecting cylinder 6 and the vacuum electron optical column wall 5, the conductive heat loss $Qc_2$ leaking from the silver cylinder 1 to the vacuum electron optical column wall 5 is given by the following formula:

$$Qc_2 = \frac{k \cdot s \cdot (T_1 - T_2)}{l}$$

where k is the heat conductivity of the connecting cylinder 6 and s is the cross-sectional area of the connecting cylinder 6, s being given by $s = \pi(d \cdot t_2 + t_2^2)$.

In view of the foregoing relationships, when the silver cylinder 1 havnng physical dimensions of d=0.5 cm, $t_1$=0.05 cm and L=5 cm is heated, if specific numerical values (k=0.03 cal·cm$^{-1}$·s$^{-1}$·deg$^{-1}$, l=1 cm, d=0.5 cm, and $t_2$=0.1 cm) are given in the foregoing formula, assuming that $T_1$=400° C. and $T_2$=20° C., the heat loss $Qc_2$ is about 5 W. Namely, at a suitable temperature 400° C. over 300° C. at which the silver allows the oxygen gas to be introduced, a small amount of electric heating power of about 5 W will suffice in an ideal condition in the silver cylinder 1 having the above-specified physical dimensions. However, actually, when the structure shown in FIG. 3 is heated by the heating wire shown in FIG. 2 and even if the cover 4 as shown in FIG. 1 is applied to the structure in order to reduce the heat loss Qe, it is necessary to heat the wire with electric powers from 50 to 100 W (although there is a difference in accordance with the oxygen gas introduction amount and the arrangement of the heating wire). This necessitates a structure by which the heat losses Qe and $Qc_1$ are considerably reduced. The method for solving the problem (2) of the oxygen introduction efficiency is very available as described below.

The problem of the oxygen introduction efficiency will be described in detail. The silver cylinder 1 is superior to components having shapes other than a cylindrical shape, such as a planar plate, in mechanical strength against a pressure (1 atm.), heating aspect, and surface area relative to that of the vacuum electron optical column wall 5. The application of the cylindrical shape ensures the introduction of the sufficient amount of the oxygen gas even if the inner diameter d shown in FIG. 3 is at 0.5 cm. However, the arrangement in which a one-end closed pipe having a length of about 5 cm with the inner diameter of 0.5 cm is mounted as shown in FIG. 3 is very ineffective in view of its conductance of evacuation. There is a large pressure difference of about ten to hundred times between the inner side of the silver cylinder 1 and the vacuum electron optical column wall 5 side in a high vacuum condition. Although this does not always means that the large amount of oxygen (ten to hundred times) is introduced through the silver cylinder since the shape is cylindrical, it is sure that its introduction efficiency is low.

In view of the foregoing discussion, a case where a mounting direction of the silver cylinder is changed opposite to that shown in FIG. 3 (that is, the atmospheric side and the vacuum side are reversed) in order to solve the problem of the heating electric power and the problem of the oxygen introduction efficiency without changing the silver cylinder will be described. Namely, the silver cylinder 1 is projected on the vacuum side. Thus, the silver cylinder is exposed in the wide vacuum chamber, thereby solving the problem of oxygen introduction efficiency. With respect to the heating power, if the heating wire can be inserted into the cylinder while keeping in the cylinder a space into which a sufficient amount of atmospheric air or oxygen is introduced, the radiative heat loss Qe may be kept substantially at zero. Therefore, the heating power consumed by the heating wire may be suppressed so that the heat loss Qc from the heating wire may be made small.

Figure 4:
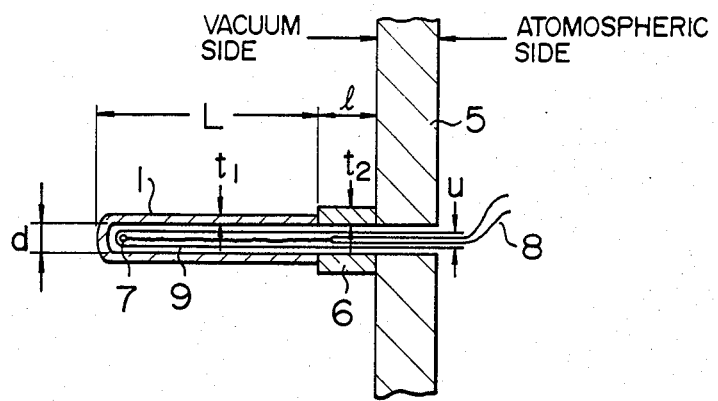
FIG. 4 is a cross-sectional view showing an oxygen gas introducing apparatus in accordance with one embodiment of the invention.

FIG. 4 is a cross-sectional view showing a primary part of one embodiment of the invention. The structural difference of the present invention over the prior art is that the silver cylinder 1 is provided to project from the vacuum electron optical column wall 5 to the vacuum side, and a heating member whose surface is coated with a heat-resistive insulator is inserted into an interior of the silver cylinder 1 which is in communication with the atmosphere. In this case, by reducing an outer diameter u of the heat-resistive insulator sufficiently in comparison with an inner diameter d of the silver cylinder 1, it is possible to introduce a sufficient amount of the atmospheric air with the interior space of the silver cylinder 1. For this reason, a heating member 7 formed of a heating wire or by a printing technique is embedded into, for example, a ceramic member 9 so as to have a rod shape having an outer diameter u, and atmosphere side terminals of the heating member 7 are connected to an electric source (not shown) through lead wires 8. The material to be embedded into the heating member 7 should be electrically insulating material in order to prevent a short-circuit in the interior of the silver cylinder 1 even with a local contact, and the material should withstand a temperature of about 400° C.

In accordance with the foregoing embodiment, as described above, the heat of the heating element 7 is substantially given to the silver cylinder 1, and a possible heat loss is only the conductive heat loss leaking through the lead wires 8. However, this heat loss may be suppressed by using a small diameter wires because the electric power needed to heat the heating wire 7 is small. This was numerically confirmed as follows. With the physical dimensions as shown in FIG. 4 (that is, d=0.5 cm, L=5 cm, $t_1$=0.05 cm, $t_2$=0.1 cm, l=1 cm, and u=0.3 cm), in order to introduce the same amount of the oxygen gas, an electric power of 50 to 100 W was needed in the prior art, whereas an electric power of 10 W was needed in accordance with the present invention.

Incidentaly, the material of the connecting cylinder 6 is not specified in the foregoing embodiment but the material having the heat conductivity k of 0.1 cal·cm$^{-1}$·s$^{-1}$·deg$^{-1}$ or less may be used by selecting the dimensions $t_2$ and l suitably.

Figure 5:
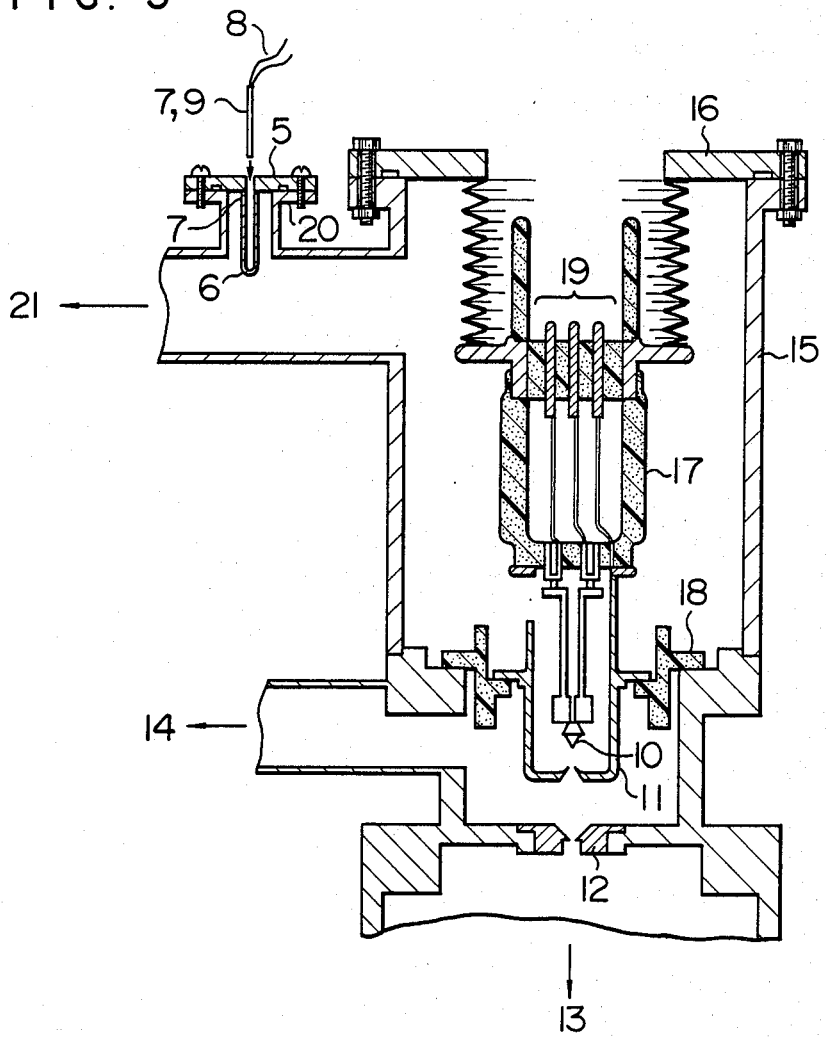
FIG. 5 is a schematic cross-sectional view showing the oxygen gas introducing apparatus according to the embodiment of the invention, which is applied to an electron gun chamber.

FIG. 5 shows a case where the present invention is applied to a gun chamber having a thermal field emission cathode. A flange on which the thermal field emission cathode 10 to be used while being heated, such as an cathode shown in U.S. Pat. No. 4,379,250 is inserted into the gun chamber 15 that is kept at a high vacuum. A so-called Butler type electro-static lens is composed of a first anode 11 for inducing electrons by applying a plus potential to the thermal field emission cathode 10 for inducing a high minus voltage with respect to a ground potential and a second anode 12 kept at the same potential as that of an electron optical column (i.e., the ground potential). By the Butler type electro-static lens, a desired electron beam is formed. The lens system is coupled to an additional electron optical system 13 composed of a magnetic lens and the like disposed below the electron optical column. The gun chamber 15 is evacuated by an evacuating pump system 21 composed of an ion pump or the like. A small flange 20 is provided between the gun chamber 15 and the evacuating pump system 21 for mounting an oxygen gas introducing apparatus in accordance with the present invention. The above-described vacuum electron optical column wall 5 is formed on the small flange 20 so as to have the above-described silver cylinder 6 and the like in exactly the same manner as described before. Thus, irrespective of whether the oxygen gas is always needed or the oxygen gas is introduced in order to temporarily activate the cathode, it is possible to readily introduce the oxygen gas without any modification to the optical systems and the vacuum elements of the apparatus. Incidentally, in FIG. 5, designated at reference numeral 14 is a connection to the evacuating pump such as an ion pump; 17 and 18, ceramics for insulating the high voltage parts and the electron optical column potential from each other; 19, a supply of a high voltage filament current to the thermal field emission cathode 10; 11, terminals for applying a high voltage to the first anode 11.

The application of the invention is not limited to the thermal field emission cathode but the invention may be applied, with the same effect, to cathodes that need a supply of the oxygen even if the cathodes are schottky emission and thermal electron emission type cathodes.

As described above, in accordance with the invention, a small amount of the electric power (one fifth to one tenth of that of the prior art) will suffice to introduce the oxygen gas. Therefore, the electric power to be needed is made small and hence the electric current is small so that the electro-magnetic obstacle to the vacuum electron optical column such as a gun beam chamber may be suppressed as much as possible. Since the oxygen introduction efficiency is increased, it is possible to supply a large amount of the oxygen to the vacuum electron optical column. Namely, it is possible to introduce a large amount of oxygen (about ten times of that of the prior art) with the same vacuum electron optical column in terms of the vacuum pressure. Since the physical size of the oxygen gas introducing apparatus is small, the invention may be applied anywhere in the vacuum electron optical column.

What is claimed is:

1. An oxygen gas introducing apparatus for introducing oxygen gas into a vacuum chamber that needs the oxygen gas, comprising:

a silver cylinder having a closed distal end, said silver cylinder being provided on a side wall of said vacuum chamber so as to project from an outside atmospheric side to an interior of said vacuum chamber; and a heating member electrically insulated and disposed within an interior of said silver cylinder, which interior is in communication with the atmosphere, wherein said silver cylinder is connected to the side wall of said vacuum chamber through a connecting cylinder formed of a material having a heat conductivity that is not greater than one tenth of that of silver.

2. An oxygen gas introducing apparatus as claimed in claim 1, wherein said heating member is coated with a heat-resistive insulator.

3. An oxygen gas introducing apparatus for introducing oxygen gas into a vacuum electron optical column of an electron beam apparatus having an electron beam source as a cathode that needs the oxygen gas, comprising:

a silver cylinder having a closed end, said silver cylinder being provided on a side wall of said vacuum electron optical column so as to project from an outside atmospheric side to an interior of said vacuum electron optical column; and a heating member electrically insulated and disposed within an interior of said silver cylinder, which interior is in communication with the atmosphere, wherein said silver cylinder is connected to the side wall of said vacuum electron optical column through a connecting cylinder formed of a material having a heat conductivity that is not greater than one tenth of that of silver.

4. An oxygen gas introducing apparatus as claimed in claim 3, wherein said heating element is coated with a heat-resistive insulator.

* * * * *